(12) United States Patent
Ku et al.

(10) Patent No.: US 7,055,578 B2
(45) Date of Patent: Jun. 6, 2006

(54) HEAT DISSIPATION DEVICE ASSEMBLY WITH FAN COVER

(75) Inventors: Chin-Long Ku, Tu-Cheng (TW); Chin-Wen Yeh, Tu-Cheng (TW)

(73) Assignee: Hon Hai Precision Industry Co., Ltd. (TW)

( * ) Notice: Subject to any disclaimer, the term of this patent is extended or adjusted under 35 U.S.C. 154(b) by 64 days.

(21) Appl. No.: 10/989,762

(22) Filed: Nov. 16, 2004

(65) Prior Publication Data

US 2005/0269060 A1 Dec. 8, 2005

(30) Foreign Application Priority Data

Jun. 3, 2004 (CN) ........................ 2004 2 0043499

(51) Int. Cl.
*H05K 7/20* (2006.01)
(52) U.S. Cl. .................. 165/80.3; 165/122; 361/697
(58) Field of Classification Search ..................... None
See application file for complete search history.

(56) References Cited

U.S. PATENT DOCUMENTS

| | | | |
|---|---|---|---|
| 5,019,880 A | 5/1991 | Higgins, III. | |
| 5,335,722 A * | 8/1994 | Wu | 165/122 |
| 5,630,469 A * | 5/1997 | Butterbaugh et al. | 165/80.3 |
| 6,330,908 B1 | 12/2001 | Lee et al. | |
| 6,360,816 B1 * | 3/2002 | Wagner | 165/122 |
| 6,452,797 B1 * | 9/2002 | Konstad | 361/695 |
| 6,538,888 B1 * | 3/2003 | Wei et al. | 361/697 |
| D481,451 S | 10/2003 | Luo | |
| D481,452 S | 10/2003 | Luo | |
| 6,657,863 B1 * | 12/2003 | Lee et al. | 361/697 |
| 6,671,172 B1 | 12/2003 | Carter et al. | |
| 6,732,786 B1 * | 5/2004 | Lee | 165/80.3 |
| 7,002,797 B1 * | 2/2006 | Wittig | 361/695 |
| 2002/0100577 A1 * | 8/2002 | Wagner | 165/80.3 |
| 2003/0230398 A1 * | 12/2003 | Lee et al. | 165/104.21 |
| 2004/0066623 A1 * | 4/2004 | Lu | 361/697 |
| 2004/0108104 A1 * | 6/2004 | Luo | 165/181 |

FOREIGN PATENT DOCUMENTS

| | | |
|---|---|---|
| CN | 00126321.8 | 3/2001 |
| CN | 01266139.2 | 10/2002 |
| TW | 491519 | 6/2002 |
| TW | 510642 | 11/2002 |
| TW | 530148 | 5/2003 |

* cited by examiner

*Primary Examiner*—Allen J. Flanigan
(74) *Attorney, Agent, or Firm*—Morris Manning & Martin; Tim Tingkang Xia, Esq.

(57) ABSTRACT

A heat dissipation device assembly comprises a heat sink having a columniform conductive core and a plurality of fins arranged radially around the conductive core, a columnar fan cover housing the heat sink and defining a first open end and a second open end, and a fan located at the second open end of the fan cover. Pluralities of channels are formed between the radiation fins. A plurality of elongated slot surrounding the heat sink is defined in the fan cover and extends from the first open end of the fan cover to the second open end. The airflow provided by the fan travels through the channels and the slots to outside of the fan cover.

20 Claims, 7 Drawing Sheets

HEAT DISSIPATION DEVICE ASSEMBLY WITH FAN COVER

BACKGROUND OF THE INVENTION

1. Field of the Invention

The present invention relates generally to a heat dissipation device, and more particularly to an improved heat dissipation device assembly with a fan cover for rapidly dissipating heat generated by an electronic element package such as a Central Processing Unit (CPU).

2. Related Art

With the continuing and rapid development of integrated circuits technology, computer has been broadly applied in industry. Along with the increase of requirement of performance, the computer runs faster and faster. The speed of a computer is mainly determined by a CPU installed on a printed circuit board in the computer. Therefore, it is required that the CPU operates at a very high frequency. However, the faster the CPU runs, the more heat it generates. Accumulation of heat at the CPU will lead to an increase of temperature of the CPU, which results in instablity of operation and even destroying the CPU. So the heat must be removed in time so as to keep the temperature of the CPU in a safety range.

A heat sink is generally mounted on the CPU to assist dissipating heat. And a fan is attached to the heat sink for providing a compelled airflow and consequently enhances the efficiency of heat dissipation of the heat sink. There are various construction designs on heat sink assembly with fan in known technology. The related patents comprise U.S. Pat. Nos. D454,947 and 6,535,385, China pat. Nos. 00126321.8 and 01266139.2 etc.

Please refer to FIG. 7. In the disclosure of one above-mentioned patent, a substantially cylindrical heat sink 100 including an erect conductive column and a plurality of fins arranged radially around the conductive column is applied. A plurality of channels is formed between the fins. A fan 200 is fixed on the top end of the conductive column for blowing forced air through the channels between the fins. As any skilled in the art has known, the temperature of the bottom portion of the heat sink 100 near the heat source (such as CPU) 300 is higher than that of the top portion of the heat sink 200 due to heat's being conducted from bottom to top along the conductive column. Airflow provided by the fan 200 will escape from the conductive column during traveling downwardly, which leads to forming of dead space around the bottom portion of the conductive column through which little airflow pass. Therefore, the heat accumulated at the bottom portion of the heat sink 100 near the heat source can not be carried away in time. The fan 200 is not utilized effectively. The accessorial heat dissipating effect of the fan 200 is limited.

SUMMARY OF THE INVENTION

It is an object of the present invention to overcome the above-mentioned problem so as to provide a heat dissipation device assembly with a fan cover capable of eliminating airflow dead space and increasing cooling performance thereof.

To achieve the above-mentioned object, a heat dissipation device assembly in accordance with a preferred embodiment of the present invention comprises a heat sink having a columniform conductive core and a plurality of fins arranged radially around the conductive core, a fan mounted to one end of the conductive core of the heat sink and a columnar fan cover housing the heat sink and the fan in. The fan cover is a hollow case defining a first open end and a second open end. A plurality of elongated slots arranged around the heat sink extends from the first open end of the fan cover to the second open end.

Other objects, advantages and novel features of the present invention will be drawn from the following detailed description of the preferred embodiment of the present invention with attached drawings, in which:

DETAILED DESCRIPTION OF THE INVENTION

Figure 1:
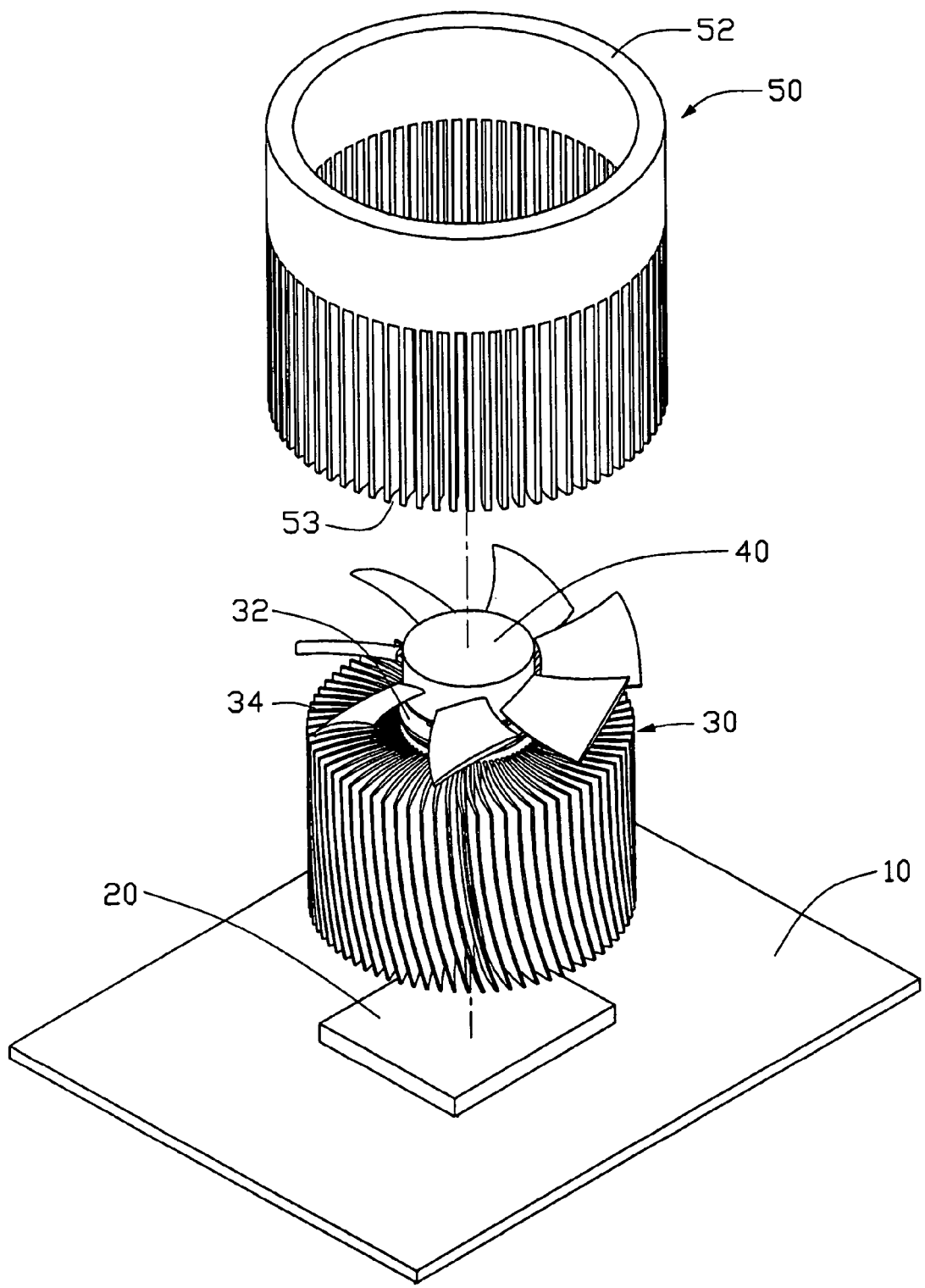
FIG. 1 is an exploded, isometric view of the heat dissipation device assembly in accordance with the preferred embodiment of the present invention.
Figure 2:
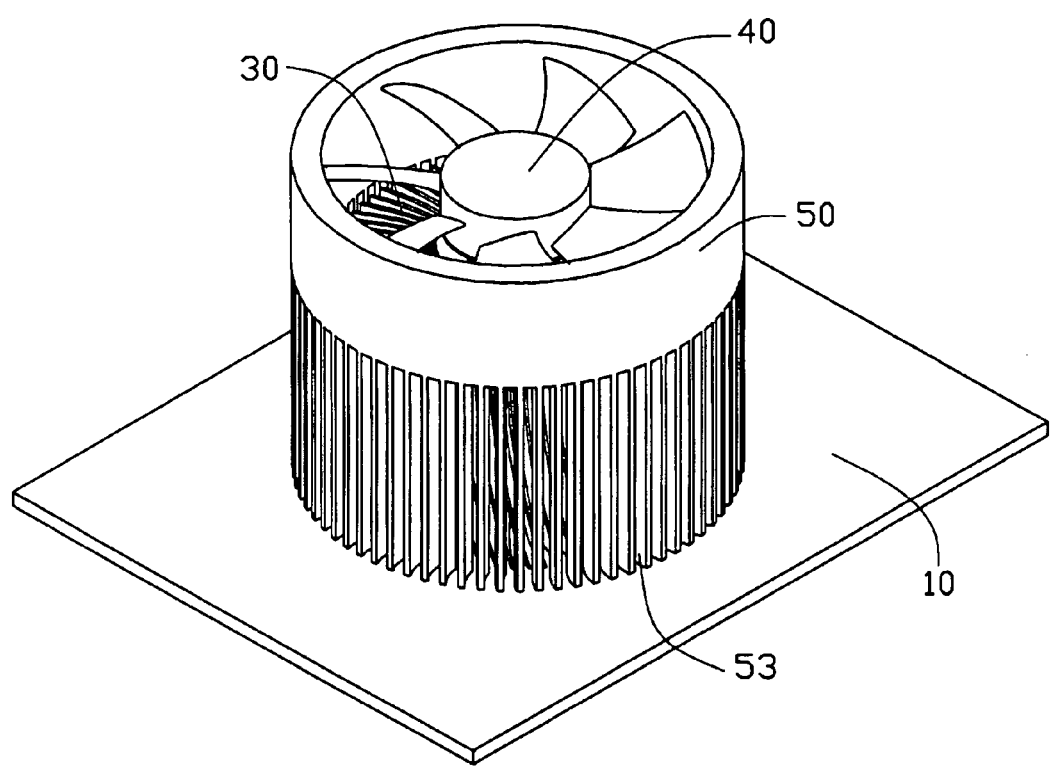
FIG. 2 is an assembled view of FIG. 1.

Referring to FIG. 1 and FIG. 2, a heat dissipation device assembly in accordance with a preferred embodiment of the present invention comprises a substantially columniform heat sink 30, a fan 40 and a fan cover 50.

The heat sink 30 includes a generally columniform conductive core 32 contacting with an electronic device 20 mounted on a printed circuit board 10, and a plurality of radiation fins 34 arranged radially on the conductive core 32 around the central line of the core 32 in a manner to be inclined with respect to the central line. Pluralities of channels are defined between the radiation fins 34. The radiation fins 34 are separately made and then combined to the conductive core 32. Alternatively, the fins 34 can also be integratedly formed with the conductive core 32. Each radiation fin 34 is curved to arc shape for leading a smooth airflow.

The fan 40 is mounted to one end of the conductive core 32 of the heat sink 30 for providing an airflow traveling through the channels between the radiation fins 34 to carry heat accumulated at the heat sink 30 away.

The fan cover 50 is a columnar hollow case defining a first open end (not visible) and a second open end 52 opposite to the first open end along the central line thereof. A plurality of parallel elongated slots 53 spaced with even distance extends from edge of the first open end of the fan cover 50 to the second open end 52 in the direction of the central line of the fan cover 50 and end at a position between the first open end and the second open end 52.

The heat sink 30 and the fan 40 are housed in the fan cover 50. The heat sink 30 is located near the first open end so that the slots 53 surround the heat sink 30. The fan 40 is located near the second open end 52.

Figure 3:
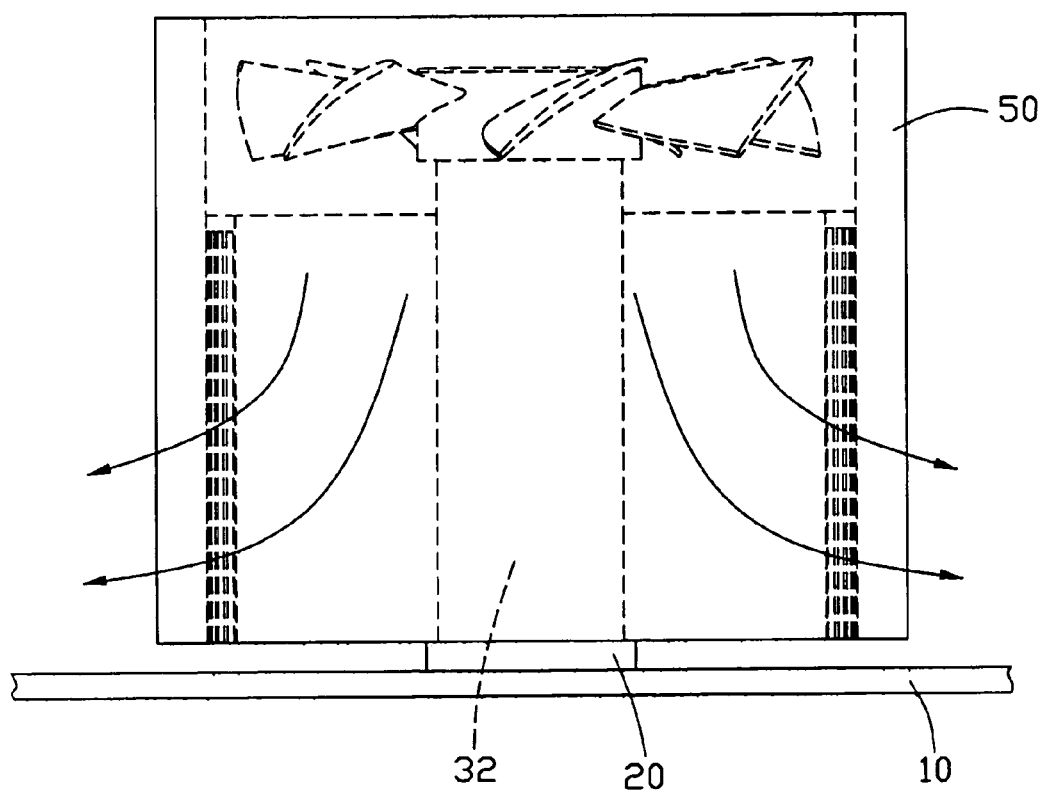
FIG. 3 is a schematic view of airflow in accordance with the preferred embodiment of the present invention.

Referring to FIG. 3, when the airflow provided by the fan 40 travels through the channels of the heat sink 30 housed in the fan cover 50. The airflow is compelled toward the conductive core 32 by the fan cover 50 and flows out of the fan cover 50 through the slots 53 near to the first open end, instead of escaping from the conductive core 32 prematurely as prior art. The heat accumulated at the bottom portion of the heat sink 30 near the first open end of the fan cover 50 is then carried away by the airflow. The above-mentioned dead space formed as the conventional heat dissipation device without using fan cover is therefore eliminated. Consequently, the heat dissipating efficiency of the heat dissipation device assembly is enhanced markedly.

Figure 4:
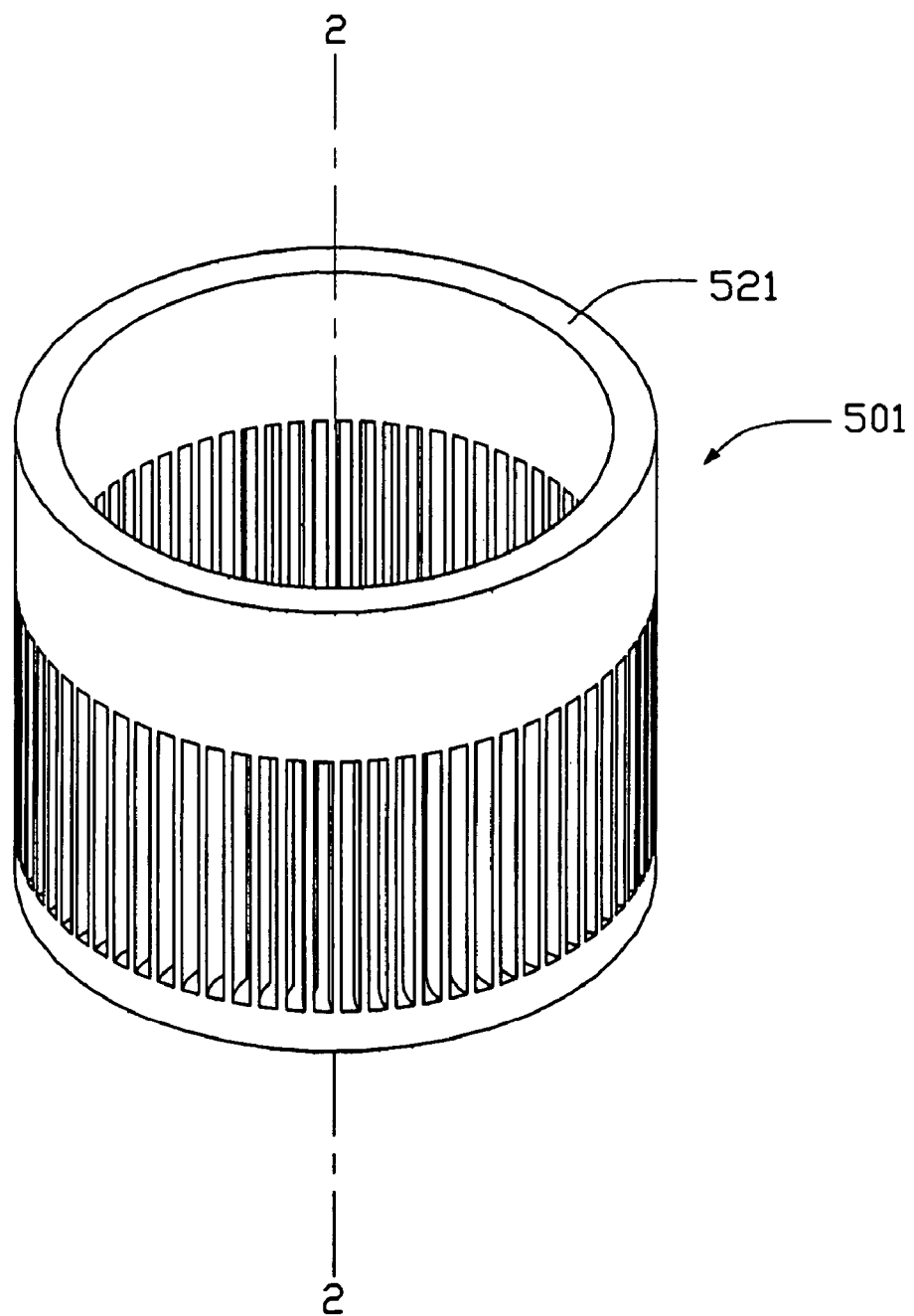
FIG. 4 is an isometric view of a fan cover in accordance with a second embodiment of the present invention.

In the above description of the preferred embodiment of the present invention, the slot 53 can also be constructed in other forms. FIG. 4 shows a second embodiment of the present invention in which an alternative fan cover 501 is illustrated. The fan cover 501 is constructed around a central line 2—2 and defines a plurality of elongated slots 531 each of which extends between the first open end (not visible) of the fan cover 501 and the second open end 521 and is parallel to the central line 2—2. Each slot 531 has two opposite closed ends adjacent the respective first and second ends of the fan cover 501. The dimension of the slot 531 in the direction of the central line 2—2 is greater than that in the direction surrounding the central line 2—2. Alternatively, the slots 531 are angled to the central line 2—2 but substantially parallel to the channels formed between the radiation fins of the heat sink.

Figure 5:
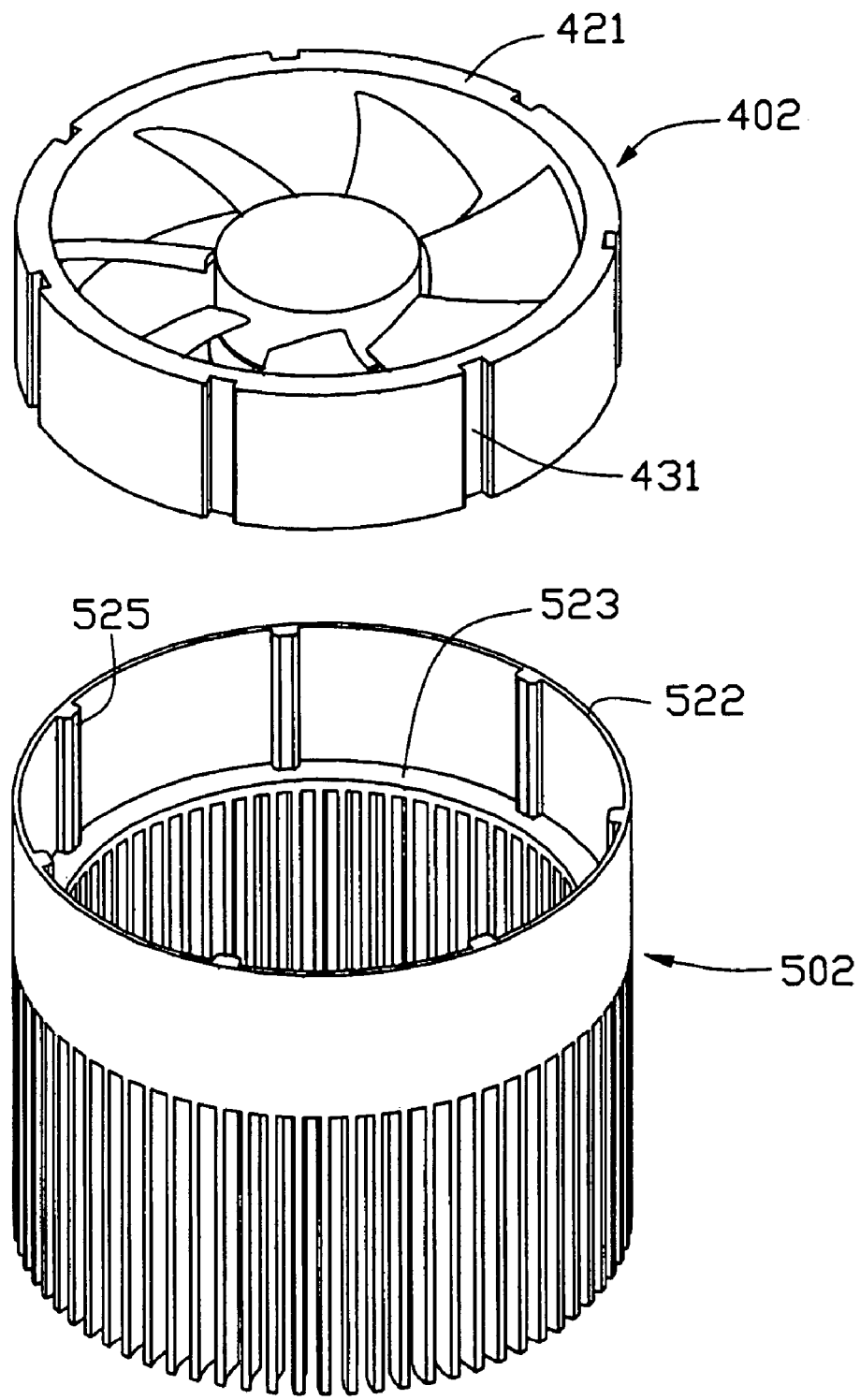
FIG. 5 is an exploded, isometric view of a fan and a fan cover in accordance with a third embodiment of the present invention.

It is obvious that the fan 40 can be mounted to the fan cover 50 instead of the heat sink 30. Referring to FIG. 5, a third embodiment of the present invention is illustrated. A fan 402 comprises a bracket 421 defining a plurality of parallel grooves 431 which are spaced with even intervals. An annular flange 523 for locating the fan 402 in the direction of the central line of the fan cover 50, and a plurality of ribs 525 substantially perpendicular to the flange 523 protrudes from the inner surface of the fan cover 502 at the second open end 522. The fan 402 is mounted to the fan cover 502 at the second open end 525 in a manner that the ribs 525 are received in the grooves 431.

Figure 6:
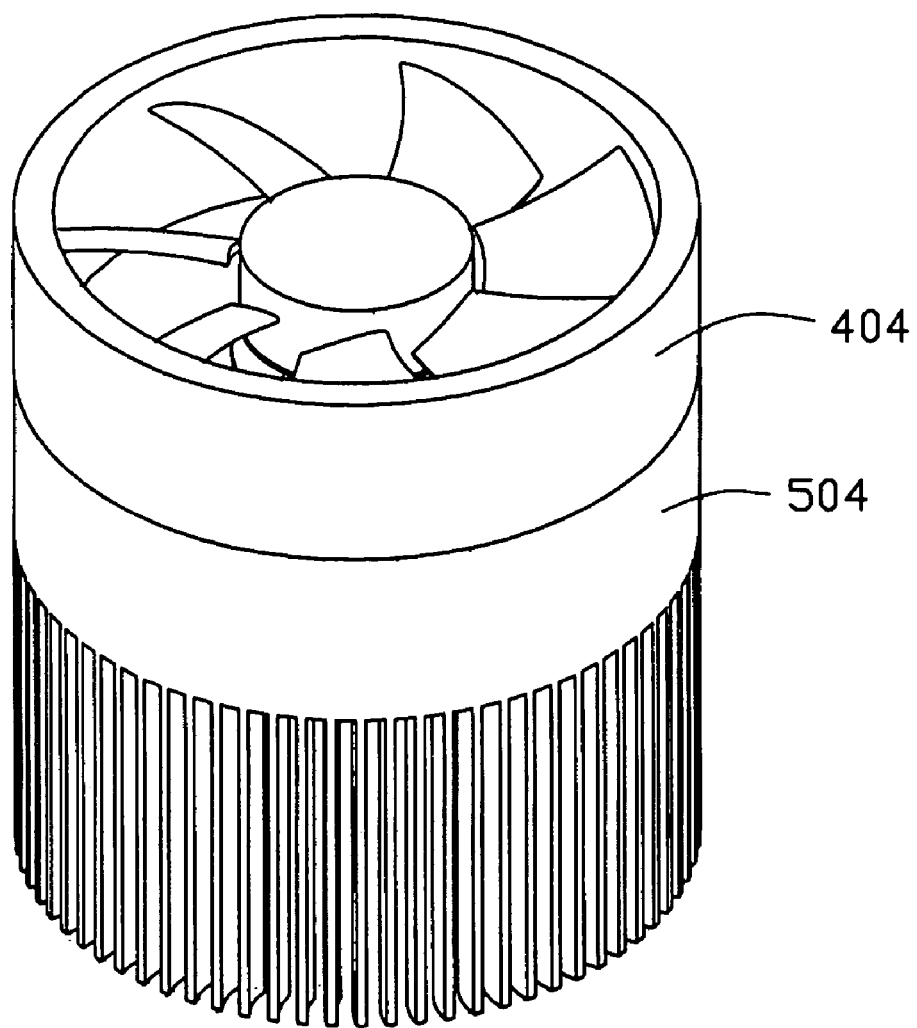
FIG. 6 is an assembled view of a fan and a fan cover in accordance with a fourth embodiment of the present invention.
Figure 7:
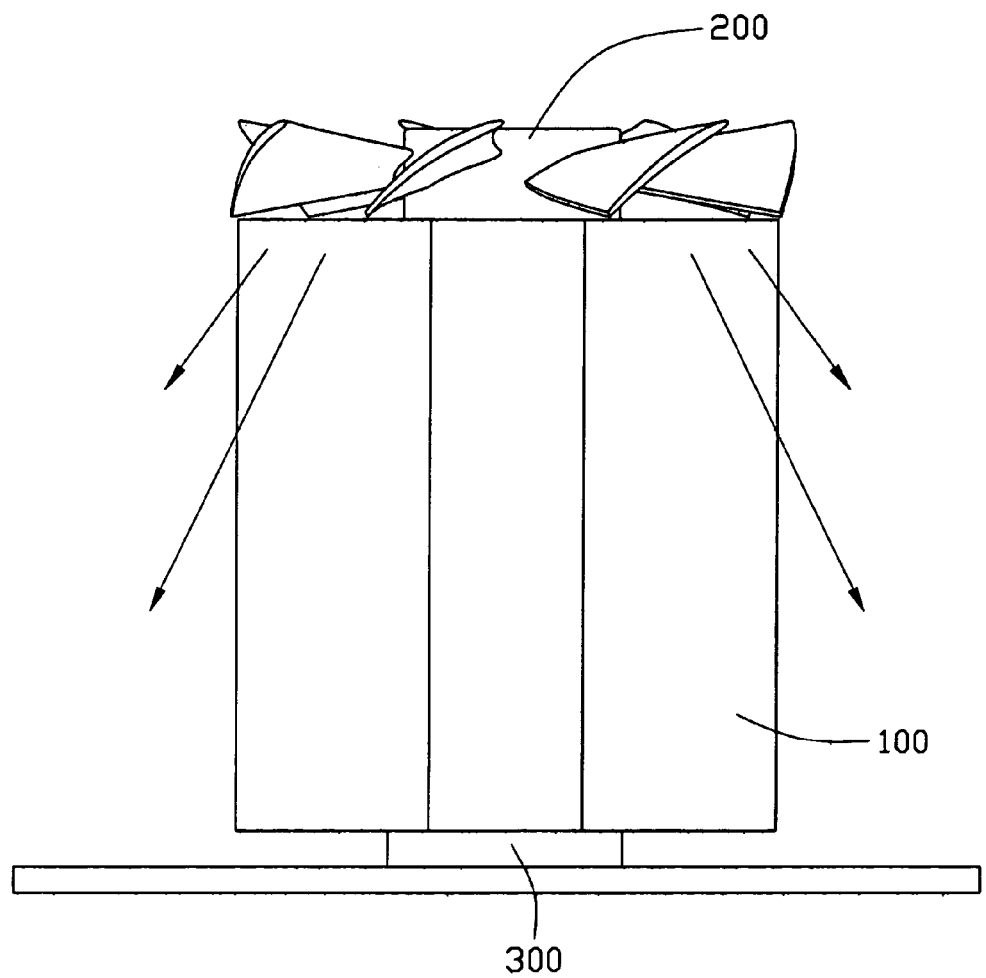
FIG. 7 is a schematic view of airflow in a conventional heat dissipation device assembly.

Furthermore, the fan 40, 402 is not limited to locate inside the fan cover 50, 501, 502 under a condition that the fan 40, 402 is adjacent to one of open ends of the fan cover and is able to provide an airflow through the heat sink 30 housed in the fan cover 50, 501, 502. Please refer to FIG. 6, a fourth embodiment of the present invention is illustrated. Comparing with the third embodiment, the fan 404 is mounted to the second open end (not labeled) of the fan cover 504 and located outside thereof. The fan 404 is mounted to the fan cover 504 by any known means, for example, a pair of hook (not shown) formed on the bracket of the fan clasping a pair of slots (not shown) defined in the fan cover 504. Alternatively, the fan 404 can also be integratedly formed with the fan cover 504 in a manner that the bracket of the fan extend downwardly to form the fan cover.

In addition, the heat sink has other shape, such as prism. The fan cover is accordingly constructed to a shape corresponding to the heat sink.

It is understood that the invention may be embodied in other forms without departing from the spirit thereof. The above-described embodiments are to be considered in all respects as illustrative and not restrictive, and the invention is not to be limited to the details given above.

What is claimed is:

1. A heat dissipation device assembly comprising:
   a heat sink comprising a conductive core and a plurality of radiation fins radially arranged around the conductive core, pluralities of channels being defined between the radiation fins;
   a fan cover housing the heat sink therein and defining along the central line thereof a first open end and a second open end opposite to the first open end, a plurality of elongated slots being defined in the fan cover and extending from the first open end to a position adjacent to the second open end; and
   a fan located adjacent to the second open end of the fan cover for providing airflow from the second open end of the fan cover through the channels and the slots to outside of the fan cover.

2. The heat dissipation device assembly as claimed in claim 1, wherein the radiation fins are arranged in a manner to be inclined with respect to the central line of the conductive core.

3. The heat dissipation device assembly as claimed in claim 2, wherein the radiation fins are curved.

4. The heat dissipation device assembly as claimed in claim 1, wherein the fan is mounted on the conductive core of the heat sink and surrounded by the fan cover at the second open end.

5. The heat dissipation device assembly as claimed in claim 1, wherein the fan is mounted to the fan cover and located inside of the fan cover at the second open end.

6. The heat dissipation device assembly as claimed in claim 5, wherein the fan cover forms an annular flange supporting the fan thereon.

7. The heat dissipation device assembly as claimed in claim 6, wherein the fan includes a bracket defining a plurality of grooves and the fan cover forms a plurality of ribs received in the grooves respectively, the ribs being perpendicular to the flange.

8. The heat dissipation device assembly as claimed in claim 1, wherein the fan is mounted to the second open end and located outside of the fan cover.

9. A heat dissipation device assembly comprising:
   a heat sink comprising a conductive core and a plurality of radiation fins arranged radially around the conductive core, pluralities of channels defined between the radiation fins;
   a fan cover housing the heat sink therein and defining along the central line thereof a first open end and a second open end opposite to the first open end, a plurality of elongated slots being defined in the fan cover and extending between the first open end and the second open end, the dimension of each slot in the direction substantially parallel to the central line being greater than that in the direction surrounding the central line; and
   a fan located at one of the first and the second open ends of the fan cover for providing airflow through the channels and the slots to outside of the fan cover.

10. The heat dissipation device assembly as claimed in claim 9, wherein the heat sink is adjacent to the first open end of the fan cover, the fan is mounted on the conductive core of the heat sink and adjacent to the second open end.

11. The heat dissipation device assembly as claimed in claim 10, wherein the slots defined in the fan cover surround the heat sink.

12. The heat dissipation device assembly as claimed in claim 9, wherein the fan is mounted to the fan cover and located inside thereof.

13. The heat dissipation device assembly as claimed in claim 9, wherein the fan further comprises a bracket defining a plurality of grooves, the fan cover defines an annular flange for preventing the fan from moving to the first open end, and a plurality ribs received respectively in the grooves of the bracket of the fan.

14. The heat dissipation device assembly as claimed in claim 9, wherein the fan is mounted to the fan cover and located outside thereof.

15. A heat dissipation device assembly comprising:
a heat sink comprising a first end and a second end opposite to the first end, and a plurality of channels formed between the first and second ends;
a fan cover surrounding the heat sink except the first and second ends and defining a plurality of elongated slots substantially parallel to the channels of the heat sink, the slots located between the first and second ends to allow the channels to communicate with outside of the fan cover; and
a fan provided adjacent one of the first and second ends for creating airflow through the channels to outside of the fan cover.

16. The heat dissipation device assembly as claimed in claim 15, wherein the heat sink comprises a conductive core and a plurality of radiation fins arranged radially around the conductive core, pluralities of channels extending from the first end to the second end are defined between the radiation fins.

17. The heat dissipation device assembly as claimed in claim 15, wherein the fan is mounted on the heat sink adjacent to one of the open ends and surrounded by the fan cover.

18. The heat dissipation device assembly as claimed in claim 15, wherein the fan is mounted to the fan cover and adjacent to one open ends of the fan cover.

19. The heat dissipation device assembly as claimed in claim 18, wherein the fan is located inside of the fan cover.

20. The heat dissipation device assembly as claimed in claim 18, wherein the fan is located outside of the fan cover.

* * * * *